Sept. 18, 1962 F. M. MEDLEY 3,054,963

DOUBLE-DIODE DETECTOR

Filed May 21, 1959

INVENTOR.
FRANCIS M. MEDLEY

BY

ATTORNEYS

1

3,054,963

DOUBLE-DIODE DETECTOR

Francis M. Medley, East Orange, N.J., assignor, by mesne assignments, to the United States of America as represented by the Secretary of the Navy Filed May 21, 1959, Ser. No. 814,937
1 Claim. (Cl. 329—204)

This invention relates to diode detectors and more particularly to diode detectors with an improved front to back ratio.

The prior art diode detectors in which the diode and load impedance are placed in series across the signal to be detected have the inherent disadvantage that any reverse conduction through the diode appears across the load impedance causing either a reduction in effective signal or distortion. In the case of a simple second detector where the signal detected is amplitude modulated, this reverse current causes an effective reduction in signal strength since it appears across the load in the opposite polarity and opposed to the intelligence as detected. In the case of a first detector or frequency converter this reverse current results in modulation of the signal which in turn creates distortion. To overcome this difficulty one prior art method was the use of reverse bias on the diode. The diode would be biased to a point equal in voltage to the voltage setup across the load by the reverse current. This of course has the disadvantage of causing distortion when the signal is too weak to balance out the bias, and of course requires careful adjustment.

It is thus an object of the present invention to provide diode detection in which the reverse current is minimized.

Another object is to provide diode detection which requires no adjustment. A further object of the invention is to provide diode detection whereby the front to back impedance ratio of the diode is effectively infinite.

According to the invention a diode detector is provided in series with a load impedance across the signal to be detected. In parallel with the load impedance is placed another diode in a back to back relationship with the first diode. Thus any reverse current conduction in the first diode will not be seen by the load impedance since the second diode will effectively short out any current in this direction.

Figure 1:
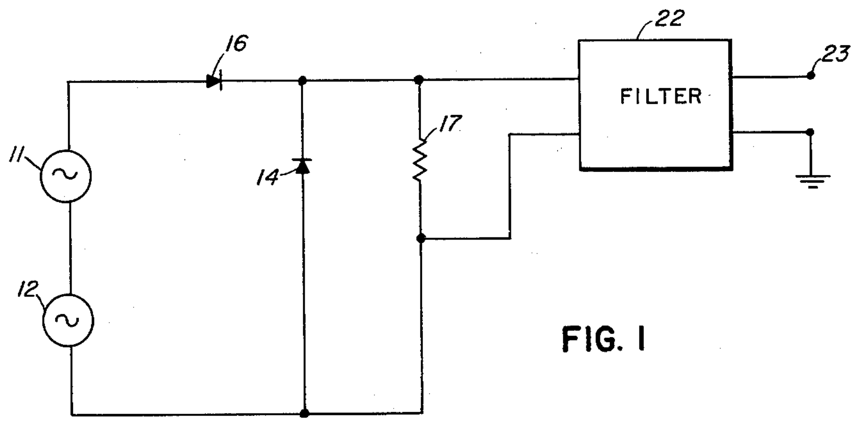
Figure 2:
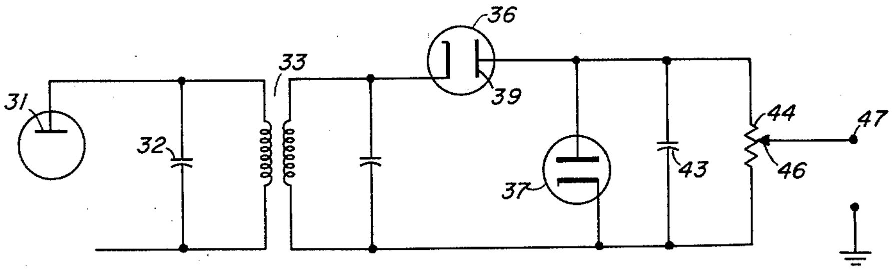

Other objects and many of the attendant advantages of this invention will be readily appreciated when the same becomes better understood by reference to the following detailed description when considered in connection with the accompanying drawings in which: FIG. 1 illustrates the present invention in conjunction with a first detector or mixer; and FIG. 2 illustrates another embodiment of the present invention in which the invention is used in conjunction with a second detector.

Referring now to FIGURE 1 there is shown a first detector or mixer in which two signals shown at 11 and 12 are being heterodyned through diode detector 16, and load 17 connected in parallel with diode 14 the output taken across load 17 is coupled into filter 22 the output of which is taken at terminal 23 and ground.

*Operation of FIG. 1*

Specific frequencies will be assigned to the incoming signal shown at 11 and the local oscillator shown at 12.

2

It is to be understood that this is for the purpose of clarity and illustration only, and not to be construed as limiting the invention to these particular frequencies. Without diode 14 the circuit shown in FIG. 1 is a conventional diode mixer. Assuming an incoming frequency of 1,000 megacycles at 11 and an oscillator frequency of 1,060 megacycles at 12 the signals appearing across load 17 will then be the original two frequencies and their sum and difference. Assuming an IF frequency of 60 megacycles is desired the difference frequency is then selected by filter 22 and the other frequencies rejected. The output taken at 23 will then be the desired intermediate frequency of 60 megacycles. As illustrated at 14 and 16 the diodes are crystals in this particular case. One of the limiting characteristics of crystal mixers is the reverse current or the fairly low front to back ratio. Thus during the period of non-conduction diode 16 is actually conducting a finite current through load 17 which as previously pointed out is highly undesirable. With the addition of crystal 14 across load 17 this reverse current is effectively shorted out and thus has a minimum of effect on the output of the mixer. While the diodes are shown as crystals in this particular high frequency illustration, it is obvious that where permissible, vacuum tube diodes can be substituted in place of crystals 14 and 16.

Referring to FIGURE 2 the last stage of an IF amplifier is shown at 31, 32, and 33. 31 is the plate of the last IF tube and condenser 32 and the primary winding of transformer 33 form the tuned tank load. This output is coupled through transformer 33 to diodes 36 and 37. The load impedance 44 is shown as a resistive potentiometer in parallel with diode 37. Capacitor 43 is also in parallel with diode 37. The output is taken at the sliding contact arm 46 of resistor 44 to terminal 47 and ground.

*Operation of FIG. 2*

In this embodiment diode detector 36 is used as a second detector and again during periods of non-conduction diode 36 will pass a certain finite reverse current through load 44 which will be in opposition to the detected signal appearing across load 44. This results in reduced gain and in some cases distortion. Capacitor 43 is connected in parallel with load 44 to provide conventional envelope detection. Without the inclusion of diode 37 the entire circuit is conventional and well known to the art. However, by placing diode 37 across load 44, with the plate 39 of diode 36 connected to the plate 41 of diode 37, any reverse current through diode 36 will be shorted out by diode 37 and not appear across load 44 nor at output terminal 47.

Thus it is seen that by a simple addition of a second diode to the conventional diode detector, the front to back ratio of resistance of the diode is effectively increased, as is the effective load impedance to plate resistance ratio of the detector on the reverse cycle, during which conduction is not wanted.

Obviously many modifications and variations of the present invention are possible in the light of the above teachings. It is therefore to be understood that within the scope of the appended claim the invention may be practiced otherwise and as specifically described.

What is claimed is:

A detector for demodulating an amplitude-modulated wave comprising first and second diodes each having an anode and a cathode, said anode of said first diode being connected to said anode of said second diode, a capacitor, said capacitor being connected in parallel with said cathode and said anode of said second diode, a load impedance having at least first and second terminals, means for connecting said first and second load impedance terminals in shunt with said capacitor, said cathode of said first diode and said cathode of said second diode being adapted to be connected to a source of amplitude-modulated wave.

References Cited in the file of this patent

UNITED STATES PATENTS

| | | |
|---|---|---|
| 1,708,573 | Hartmann et al. | Apr. 9, 1929 |
| 2,109,561 | Wright | Mar. 1, 1938 |
| 2,227,906 | Kellogg | Jan. 7, 1941 |
| 2,259,532 | Nicholson | Oct. 21, 1941 |
| 2,466,959 | Moore | Apr. 12, 1949 |
| 2,679,584 | MacDonald | May 25, 1954 |
| 2,832,888 | Houston | Apr. 29, 1958 |